(12) United States Patent
Yaffe et al.

(10) Patent No.: US 10,909,824 B2
(45) Date of Patent: Feb. 2, 2021

(54) SYSTEM AND METHOD FOR PULSED LIGHT PATTERN CAPTURING USING A DYNAMIC VISION SENSOR

(71) Applicant: Samsung Electronics Co., Ltd., Suwon-si (KR)

(72) Inventors: Yoel Yaffe, Modiin (IL); Nathan Henri Levy, Givatayim (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 231 days.

(21) Appl. No.: 16/103,379

(22) Filed: Aug. 14, 2018

(65) Prior Publication Data

US 2020/0058205 A1 Feb. 20, 2020

(51) Int. Cl.
| | |
|---|---|
| *H04N 5/341* | (2011.01) |
| *H04N 5/353* | (2011.01) |
| *G08B 13/196* | (2006.01) |
| *H04N 5/369* | (2011.01) |
| *H01L 27/146* | (2006.01) |
| *G01B 11/25* | (2006.01) |

(52) U.S. Cl.
CPC .... *G08B 13/1961* (2013.01); *H01L 27/14603* (2013.01); *H04N 5/3696* (2013.01)

(58) Field of Classification Search
CPC .......... G08B 13/1961; H01L 27/14603; H04N 5/3696; H04N 5/2256; H04N 5/341; H04N 5/353; H04N 5/365; H04N 5/3741; G01B 11/25
USPC .......................................................... 348/136
See application file for complete search history.

(56) References Cited

U.S. PATENT DOCUMENTS

| | | | |
|---|---|---|---|
| 2010/0182468 A1* | 7/2010 | Posch .................... | H04N 5/335 348/294 |
| 2014/0125994 A1* | 5/2014 | Kim ........................ | G01B 11/22 356/601 |
| 2014/0240492 A1* | 8/2014 | Lee ..................... | H04N 5/23219 348/136 |
| 2015/0002734 A1* | 1/2015 | Lee ...................... | H04N 5/3532 348/367 |

(Continued)

OTHER PUBLICATIONS

Jun Seok Kim, U.S. Appl. No. 15/866,920 entitled "Pixel, Pixel Driving Circuit, and Vision Sensor Including the same".

(Continued)

*Primary Examiner* — Christopher S Kelley
*Assistant Examiner* — Kathleen M Walsh
(74) *Attorney, Agent, or Firm* — F. Chau & Associates, LLC (57) ABSTRACT

A pulsed image capturing system includes a pulse generation circuit, a dynamic vision sensor (DVS), and a DVS scanning and readout circuit. A global reset signal is transmitted to pixels of the DVS to set a reference illumination level for the pixels, and then a pulsed light pattern is generated. A global hold signal is transmitted to the pixels, after the pulsed light pattern is generated, to hold an illumination change event indicating a change with respect to the reference illumination level. A DVS scanning and readout operation is performed on event signals received from the pixels, after the global hold signal is transmitted to the pixels. A reflection of the pulsed light pattern is extracted from the DVS output after cleaning artifacts from the DVS output without additional image processing.

15 Claims, 5 Drawing Sheets

(56) References Cited

U.S. PATENT DOCUMENTS

2015/0285625 A1* 10/2015 Deane ................... G01S 17/48
    348/140
2016/0162011 A1* 6/2016 Verma ................ G06F 3/04162
    345/173

OTHER PUBLICATIONS

Hee Jae Jung, U.S. Appl. No. 15/896,807 entitled "Event Detecting Device".

* cited by examiner

SYSTEM AND METHOD FOR PULSED LIGHT PATTERN CAPTURING USING A DYNAMIC VISION SENSOR

TECHNICAL FIELD

Exemplary embodiments of the inventive concept relate to imaging systems, and more particularly, to a system and method for pulsed light pattern capturing using a dynamic vision sensor.

DISCUSSION OF RELATED ART

In depth measurement methods such as structured light, a short pulsed illumination or light pattern is applied on a scene and an image resulting from reflectance of the pattern is captured. Pulsed image capturing by an imaging system may be limited by ambient light in the scene, which becomes added to the captured image. This may result in either saturation of the imaging system or an increase in a noise floor due to ambient light shot noise, making the pulsed light pattern hard to detect. Separation of the pulsed light pattern from the ambient light requires significant image processing, which may increase system complexity and power consumption. Dynamic vision sensors (DVS), which observe the scene and capture events related to the pulsed light pattern as well as the events related with scene changes due to camera and object movement, may be used but would require multiple light pulses for detection and significant processing to isolate the light pulses from a dynamic scene.

As discussed, pulsed image capturing in high ambient illumination environments, such as the outdoors, may be difficult. Traditional setups for capturing include a pulsed light source and a CMOS image sensor. The CMOS image sensor runs at a fixed frame rate and generates signals for triggering the pulsed light source in sync with sensor exposure. However, the CMOS image sensor captures both ambient light and the light related to the pulsed light source. Various methods may be applied to increase the proportion of the pulsed light source to the ambient light within the captured signal. For example, a global shutter image sensor may be used rather than a rolling shutter to allow maximal overlap of pulsed light duration and exposure time, the pulsed light may be timed to start before sensor exposure starts for maximal overlap, energy of the pulsed light source may be increased, etc. Regardless, the ambient light and the light related to the pulsed light source are both captured by the CMOS image sensor and the pattern must then be extracted by means of subsequent image processing.

SUMMARY

According to an exemplary embodiment of the inventive concept, a pulsed image capturing system includes a pulse generation circuit, a dynamic vision sensor (DVS), and a DVS scanning and readout circuit. The pulse generation circuit is configured to generate a pulsed light pattern at an external object. The DVS includes a pixel array having a plurality of pixels arranged in matrix form. The plurality of pixels are configured to sense an amount of light from the pulsed light pattern reflected by the external object and output event signals. The DVS scanning and readout circuit is configured to perform a DVS scanning and readout operation on the event signals received from the plurality of pixels to generate a DVS output. A global reset signal is transmitted to the plurality of pixels to set a reference illumination level for each of the plurality of pixels. The pulsed light pattern is generated after the global reset signal is transmitted to the plurality of pixels. A global hold signal is transmitted to the plurality of pixels, after the pulsed light pattern is generated, to hold an illumination change event indicating a change with respect to the reference illumination level for each of the plurality of pixels. The DVS scanning and readout operation is performed after the global hold signal is transmitted to the plurality of pixels. A captured reflection of the pulsed light pattern is extracted from the DVS output after cleaning DVS-related artifacts from the DVS output without additional image processing.

According to an exemplary embodiment of the inventive concept, a pulsed image capturing system includes a pulse generation circuit, a dynamic vision sensor (DVS), a DVS scanning and readout circuit, and a plurality of multiplexers. The pulse generation circuit is configured to generate a pulsed light pattern at an external object. The DVS includes a pixel array having a plurality of pixels arranged in matrix form. The plurality of pixels are configured to perform a light sensing operation to sense an amount of light from the pulsed light pattern reflected by the external object and output event signals. The DVS scanning and readout circuit is configured to perform a DVS scanning and readout operation on the event signals received from the plurality of pixels to generate a DVS output. The plurality of multiplexers are configured to select a plurality of control signals. The plurality of control signals synchronize operation of the pulsed image capturing system such that the light sensing operation is performed after the pulsed light pattern is generated and before the DVS scanning and readout operation is performed.

According to an exemplary embodiment of the inventive concept, in a method of operating a pulsed image capturing system including a dynamic vision sensor (DVS) including a pixel array having a plurality of pixels, the method includes activating a global reset signal and transmitting the global reset signal to each of the plurality of pixels to set a reference illumination level for each of the plurality of pixels, deactivating the global reset signal to enable each of the plurality of pixels to sense an illumination change amount with respect to the reference illumination level thereof, activating a pulsed light pattern directed at an external object, activating a global hold signal and transmitting the global hold signal to each of the plurality of pixels to hold an illumination change event indicating the illumination change amount thereof, performing a DVS scanning and readout operation on the event signals received from the plurality of pixels and generating a DVS output, and deactivating the pulsed light pattern.

According to an exemplary embodiment of the inventive concept, in a method of operating a pulsed image capturing system including a dynamic vision sensor (DVS) including a pixel array having a plurality of pixels, the method includes synchronizing activation of a global reset signal and activation of a global hold signal to be transmitted to the plurality of pixels, activating a pulsed light pattern directed at an external object between the activation of the global reset signal and the activation of the global hold signal, generating event signals, by the plurality of pixels, according to a sensed illumination change amount in response to the pulsed light pattern, generating a DVS output using the event signals, cleaning DVS-related artifacts from the DVS output, and extracting a captured reflection of the pulsed light pattern from the DVS output after cleaning the DVS-related artifacts without additional image processing.

According to an exemplary embodiment of the inventive concept, in a method of operating a pulsed image capturing system including a dynamic vision sensor (DVS) including a pixel array having a plurality of pixels, the method includes synchronizing activation of a global reset signal to be transmitted to the plurality of pixels to set a reference illumination level for each of the plurality of pixels, deactivating the global reset signal to enable each of the plurality of pixels to sense an illumination change amount with respect to the reference illumination level thereof, activating a pulsed light pattern directed at an external object after deactivation of the global reset signal, generating event signals, by the plurality of pixels, according to a comparison between a predetermined threshold and the sensed illumination change amount resulting from the pulsed light pattern, and performing a DVS scanning and readout operation on the event signals received from the plurality of pixels and generating a DVS output.

BRIEF DESCRIPTION OF THE DRAWINGS

The above and other features of the inventive concept will become more apparent by describing in detail exemplary embodiments thereof, with reference to the attached drawings.

DETAILED DESCRIPTION OF THE EMBODIMENTS

Exemplary embodiments of the inventive concept provide a system and method for pulsed light pattern capturing using an event or a dynamic vision sensor (DVS) with a synchronized global hold and global reset mechanism. DVS has unique characteristics including a high dynamic range and a capability of detecting contrast changes over time. In response to a global reset signal, all previous stored events are reset and a circuit in each sensor pixel samples the incoming illumination as a reference illumination level. Subsequently, the sensor pixels enter a wait monitoring state when any change in incoming illumination with respect to the stored reference illumination level is amplified. If a change exceeds a predefined sensitivity threshold, a contrast change event is generated and recorded in the sensor pixel. A global hold signal, when activated or asserted, locks the recorded events and prevents recording of additional events until the global hold signal is deactivated. A DVS readout and scanning circuit reads the recorded events from the pixels. Therefore, the above-discussed system and method may capture a binary image resulting from reflectance of a short illumination pattern applied on a scene while suppressing other signals arising from ambient light and scene content.

Exemplary embodiments of the inventive concept will be described more fully hereinafter with reference to the accompanying drawings. Like reference numerals may refer to like elements throughout the specification and drawings.

Figure 1:
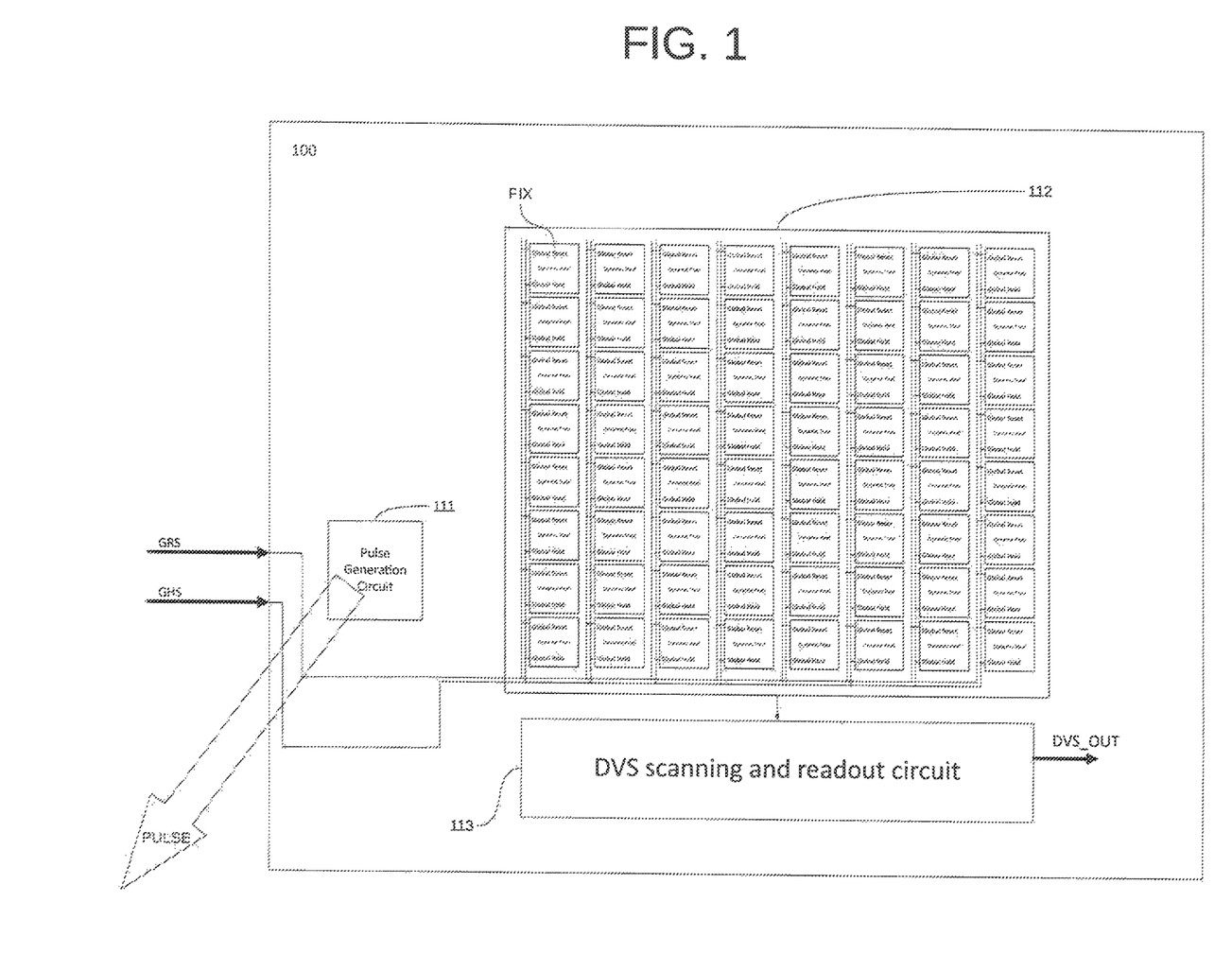
FIG. 1 is a block diagram illustrating a pulsed image capturing system according to an exemplary embodiment of the inventive concept.

FIG. 1 is a block diagram illustrating a pulsed image capturing system according to an exemplary embodiment of the inventive concept.

Referring to FIG. 1, a pulsed image capturing system 100 includes a pulse generation circuit 111, a dynamic vision sensor (DVS) 112 including a pixel array, and a DVS scanning and readout circuit 113.

The pulse generation circuit 111 may be configured to generate a pulsed light pattern PULSE at an external object.

The pulsed light pattern PULSE may be visible or invisible light in any spectrum, for example, infrared (IR) light. According to an exemplary embodiment of the inventive concept, the pulsed light pattern PULSE may be generated by one of a light emitting diode (LED), a vertical-cavity surface-emitting laser (VCSEL), or another type of laser or light source. For example, an IR VCSEL may generate the pulsed light pattern PULSE.

The pulsed light pattern PULSE may be structured light. In other words, the pulsed light pattern PULSE may be a predetermined pattern that is projected onto the external object, e.g., to calculate depth and/or surface information of the external object.

The pulsed light pattern PULSE may include a sequence of patterns. Each of the sequence of patterns may be handled separately in a series of operations, which will be described in detail below with reference to FIG. 4. The sequence of patterns may be used to capture different patterns or to capture the same pattern with different configurable conditions. For example, configurable conditions may include different pixel sensitivity thresholds or different times between generation of the pulsed light pattern PULSE and assertion of a global hold signal, which will be described below. Capturing the same pattern in different conditions would result in more points detected in higher sensitivity cases and less in others, thus allowing reconstruction of a grey scale image of the pulsed light pattern PULSE through different combinations of binary event images, for example, by summation or weighted average.

The pixel array of the DVS 112 includes a plurality of pixels PIX arranged in matrix form with matching optics. Each of the plurality of pixels PIX includes a photodiode embedded in a dynamic vision pixel circuit configured to sample a response to incoming illumination before the pulsed light pattern PULSE is generated and store the response as a reference illumination level, in response to a global reset signal. The pixel PIX may enter a wait monitoring state to compare incoming illumination with the stored reference illumination level, and amplify this differential signal. When the incoming illumination changes as a result of the pulsed light pattern PULSE generation, the amplified differential signal may exceed a predefined but configurable sensitivity threshold, and a contrast change event is generated and recorded in the pixel PIX for future readout. The contrast change event may be an indication of change or an indication of both change and a change direction, e.g., increase or decrease of illumination. The dynamic vision pixel circuit may be configured according to the global hold signal. When activated, the global hold signal locks the recorded events and prevents generation of additional new events until it is deactivated. The global reset signal and the global hold signal will be described further below.

The DVS scanning and readout circuit 115 may be configured to perform a DVS scanning and readout operation on the event signals received from the plurality of pixels PIX and generate a DVS output DVS_OUT. For example, the DVS scanning and readout circuit 115 may operate according to an Address Event Representation (AER) protocol or model.

For example, the DVS scanning and readout circuit 115 may be implemented as a row driver and an address generator. The row driver may be configured to detect whether an event has occurred from the event signals received from the plurality of pixels PIX. The event signals may be transmitted to the address generator, which converts an address and a type of a pixel in which the event occurred into data of a predetermined format (e.g., the AER protocol) as the DVS output DVS_OUT.

Through the above-described configuration, the DVS output DVS_OUT may include binary data representing a captured reflection of the pulsed light pattern PULSE without ambient or scene related content. DVS-related artifacts such as bad pixels may be cleaned from the DVS output DVS_OUT and the DVS output DVS_OUT may then be processed directly by an application without a need for pre-filtering or additional image processing to extract the captured reflection of the pulsed light pattern PULSE.

An operation of the pulsed image capturing system 100 will be described in more detail hereinafter.

A global reset signal GRS may be transmitted to the plurality of pixels PIX to clean previous events and set a new reference illumination level for each of the plurality of pixels PIX. In other words, the global reset signal GRS may reset previous event data stored in the plurality of pixels PIX, and reset the reference illumination level to represent the current illumination level detected by a respective pixel and store it as reference.

The pulsed light pattern PULSE may be generated after the global reset signal GRS is transmitted to the plurality of pixels PIX. As described above, the plurality of pixels PIX, on which illumination change occurred, detect the illumination change and sample an internal event.

A global hold signal GHS may be transmitted to the plurality of pixels PIX, after the pulsed light pattern PULSE is generated, to hold all the internal recorded events which were recorded so far for each of the plurality of pixels PIX. For example, a capacitor in each of the plurality of pixels PIX may store an illumination change event in response to the global hold signal GHS. For example, for each of the plurality of pixels PIX, when the illumination change amount exceeds a predetermined threshold, an event signal having an "ON" or high logic level may be generated and output by the corresponding pixel. In other words, the plurality of pixels PIX detect changes in light intensity. According to an exemplary embodiment of the inventive concept, the duration between generation of the pulsed light pattern PULSE and transmission of the global hold signal GHS may be increased to increase sensitivity to contrast change.

The DVS scanning and readout operation may be performed, after the global hold signal GHS is transmitted to the plurality of pixels PIX, to generate the DVS output DVS_OUT using the event signals recorded and read out from the plurality of pixels PIX.

In other words, activation of the global reset signal GRS and activation of the global hold signal GHS may be synchronized. Activation of the pulsed light pattern PULSE may occur between the activation of the global reset signal GRS and the activation of the global hold signal GHS. The above-described operations of the global reset signal GRS, the pulsed light pattern PULSE, and the global hold signal GHS may be collectively referred to as a synchronization mechanism of the pulsed image capturing system 100.

According to an exemplary embodiment of the inventive concept, the global reset signal GRS and the global hold signal GHS may be generated by one of the pulse generation circuit 111 and the DVS scanning and readout circuit 113. According to an exemplary embodiment of the inventive concept, the global reset signal GRS and the global hold signal GHS may be generated by an external controller. In other words, the synchronization mechanism may be physically implemented as part of the pulsed generation circuit 111 or the DVS scanning and readout circuit 113, or may be separate from the pulsed image capturing system 100 and reside in a higher level system.

According to an exemplary embodiment of the inventive concept, the pulsed image capturing system 100 may further include a configuration register configured to store a rate of capture of the pulsed image capturing system 100 and to generate the global hold signal GHS and the global reset signal GRS.

According to an exemplary embodiment of the inventive concept, the global hold signal GHS and the global reset GRS may be generated in a cyclic manner, which will be described with reference to FIG. 5. Further, configurations such as time delay or sensitivity thresholds may be changed for each cycle in accordance with desired sensitivity.

According to an exemplary embodiment of the inventive concept, a process of transmitting the global reset signal GRS, generating the pulsed light pattern PULSE, transmitting the global hold signal GHS, and performing the DVS scanning and readout operation may be repeated for a predetermined number of passes. The DVS output DVS_OUT of the predetermined number of passes may be averaged to generate a final DVS output. Alternatively, a median or mode of multiple DVS outputs DVS_OUT may be determined as the final DVS output. Whether an average, mean, or mode is used may be based on noise characteristics. Accordingly, temporal noise may be reduced and a signal-to-noise ratio (SNR) may be improved. As another example, multiple DVS outputs DVS_OUT may be combined to create or generate a grey scale image of the pulsed light pattern PULSE.

According to an exemplary embodiment of the inventive concept, instead of generating the pulsed light pattern PULSE by the pulse generation circuit 111, the pulsed image capturing system 100 may constantly generate light. To perform the DVS scanning and readout operation, the light may be turned off for a short period of time (e.g., in lieu of the pulsed light pattern PULSE) in accordance with the synchronization mechanism described above.

Figure 2:
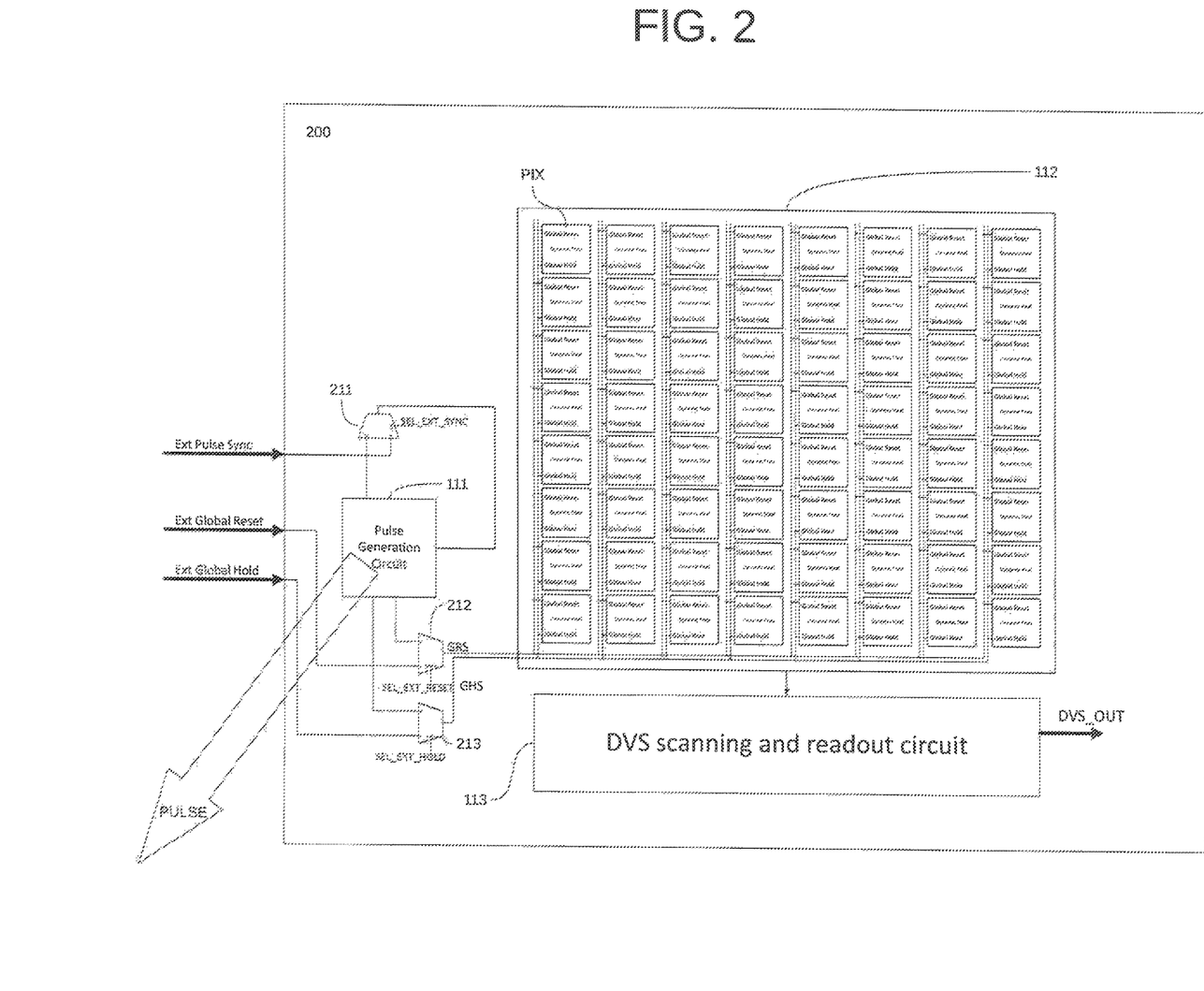
FIG. 2 is a block diagram illustrating a pulsed image capturing system including a plurality of multiplexers according to an exemplary embodiment of the inventive concept.

FIG. 2 is a block diagram illustrating a pulsed image capturing system including a plurality of multiplexers according to an exemplary embodiment of the inventive concept.

Referring to FIG. 2, a pulsed image capturing system 200 may be similar to the pulsed image capturing system 100 of FIG. 1. For example, the pulsed image capturing system 200 may include the pulse generation circuit 111, the DVS 112, and the DVS scanning and readout circuit 113. Thus, repeat descriptions will be omitted.

The pulsed image capturing system 200 may further include a plurality of multiplexers configured to select a plurality of control signals. Similar to as described above, the plurality of pixels PIX may be configured to perform a light sensing operation to sense an amount of light from the pulsed light pattern PULSE reflected by the external object. The plurality of pixels PIX may also detect when the pulsed light pattern PULSE is turned off. The plurality of control signals synchronize operation of the pulsed image capturing system 200 such that the light sensing operation is performed after the pulsed light pattern PULSE is generated and before the DVS scanning and readout operation is performed.

According to an exemplary embodiment of the inventive concept, the plurality of multiplexers may include a first multiplexer 211, a second multiplexer 212, and a third multiplexer 213.

The first multiplexer 211 may be configured to select one of an internal light pulse synchronization signal and an external light pulse synchronization signal in response to a first selection signal SEL_EXT_SYNC. The internal pulse synchronization signal may be generated by the pulse generation circuit 111. One of the internal light pulse synchronization signal and the external light pulse synchronization may be transmitted to the pulse generation circuit 111 to control when the pulsed light pattern PULSE is generated.

The second multiplexer 212 may be configured to select one of an internal global reset signal and an external global reset signal in response to a second selection signal SEL_EXT_RESET. One of the internal global reset signal and the external global reset signal may be transmitted as the global reset signal GRS to control whether each of the plurality of pixels PIX sets the reference illumination level in a current state.

The third multiplexer 213 may be configured to select one of an internal global hold signal and an external global hold signal in response to a third selection signal SEL_EXT_HOLD. One of the internal global hold signal and the external global hold signal may be transmitted as the global hold signal GHS to control whether the plurality of pixels PIX hold an illumination change event indicating a change with respect to the reference illumination level for each of the plurality of pixels PIX.

According to an exemplary embodiment of the inventive concept, the external light pulse synchronization signal, the external global reset signal, and the external global hold signal may be generated by an external controller.

According to an exemplary embodiment of the inventive concept, the first selection signal SEL_EXT_SYNC, the second selection signal SEL_EXT_RESET, and the third selection signal SEL_EXT_HOLD may be generated by an external controller or within the pulsed image capturing system 200.

According to an exemplary embodiment of the inventive concept, the first selection signal SEL_EXT_SYNC, the second selection signal SEL_EXT_RESET, and the third selection signal SEL_EXT_HOLD may be distinct signals. Alternatively, two or more of the first selection signal SEL_EXT_SYNC, the second selection signal SEL_EXT_RESET, and the third selection signal SEL_EXT_HOLD may be the same signal.

Figure 3:
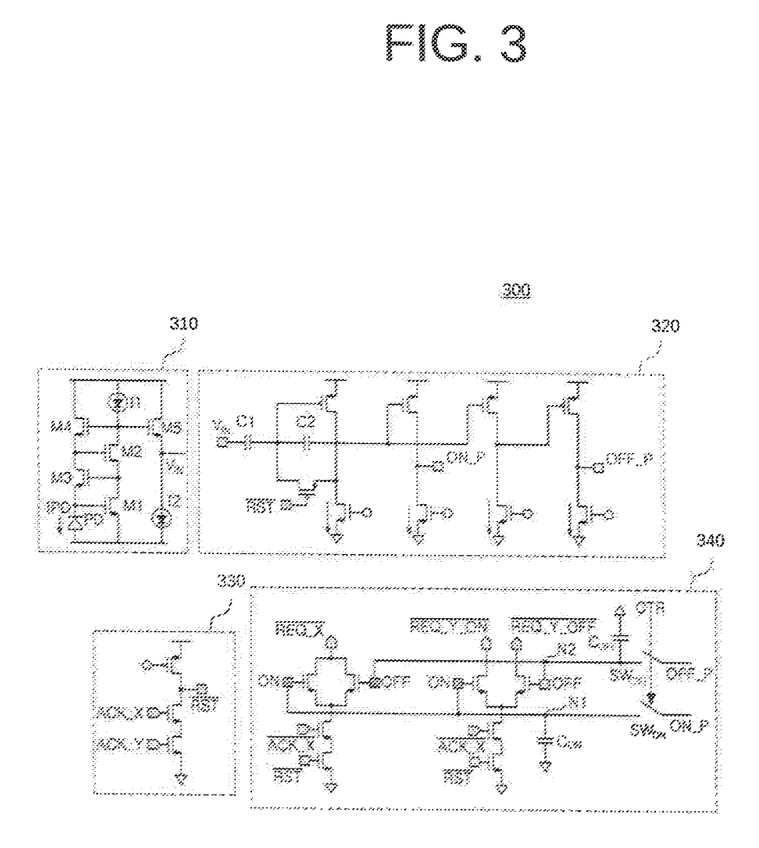
FIG. 3 is a diagram illustrating a pixel of a pixel array of FIGS. 1 and 2 according to an exemplary embodiment of the inventive concept.

FIG. 3 is a diagram illustrating a pixel of a pixel array of FIGS. 1 and 2 according to an exemplary embodiment of the inventive concept. U.S. patent application Ser. No. 15/866,920 describes the below configuration as well as other suitable configurations for the pixel.

With reference to FIG. 3, a pixel 300 may be configured to include a current readout unit 310, an event determination unit 320, an event reset unit 330, and an event output unit 340. Further, the circuit diagram of respective components illustrated in FIG. 3 is merely provided by way of example, and thus, may be variously modified and implemented in the art. The pixel 300 may correspond to the pixel PIX of the DVS 112 described above.

The current readout unit 310 may detect a current IPD flowing in a photoelectric device PD to generate an input voltage VIN. The input voltage VIN may be applied to the event determination unit 320 and may be used to determine whether an event has occurred and a type of the occurred event.

In this case, the event may include a dynamic input, for example, a change in light intensity of incident light. The dynamic input may be provided by movement of an object, a change in light projected on an object (e.g., the pulsed light pattern PULSE on the external object), a change in light emitted by an object, or the like.

The event determination unit 320 may determine whether an event has occurred or not and may determine an event type, using the input voltage VIN, and may output an event detection signal depending on the determination result.

In an exemplary embodiment of the inventive concept, when the current IPD flowing through the photoelectric device PD increases to a predetermined value or more, the event determination unit 320 may determine that the event occurred, for example, an on-event has occurred. When the on-event has occurred, an on-event detection signal ON_P of the event determination unit 320 may be activated.

In an exemplary embodiment of the inventive concept, when the current IPD flowing in the photoelectric device PD decreases to a specific value or less, the event determination unit 320 may determine that an off-event has occurred. When the off-event has occurred, an off-event detection signal OFF_P of the event determination unit 320 may be activated.

The on-event detection signal ON_P and the off-event detection signal OFF_P may be output through an on-event output terminal ON and an off-event output terminal OFF, respectively, of the event output unit 340.

The event reset unit 330 may reset pixels to an initial state in response to a reset signal RST (e.g., the global reset signal GRS). The event output unit 340 may store an event detection signal output by the event determination unit 320 for an event storage period, and may output the stored event detection signal when an event-hold period arrives.

In an exemplary embodiment of the inventive concept, the event output unit 340 may include an off-capacitor COFF connected between a node N2 connected to the off-event output terminal OFF and a ground, and an on-capacitor CON connected between a node N1 connected to the on-event output terminal ON and a ground.

The off-event detection signal OFF_P and the on-event detection signal ON_P may be input to the off-capacitor COFF and the on-capacitor CON, respectively, through an off-switch SWOFF and an on-switch SWON, respectively. The off-capacitor COFF and the on-capacitor CON may operate as a kind of sampling circuit storing the event detection signal therein.

In an exemplary embodiment of the inventive concept, while the off-switch SWOFF and the on-switch SWON are turned on, event occurrence data determined by the event determination unit 320 may be stored in the off-capacitor COFF and the on-capacitor CON. For example, when the off-switch SWOFF and the on-switch SWON are turned off in response to a switch control signal CTR (e.g., the global hold signal GHS), the event occurrence data at the moment of the turnoff may be stored in the off-capacitor COFF and the on-capacitor CON. Thus, the event occurrence data may be stored in the capacitor at substantially the same point in time by simultaneously turning off the off-switch SWOFF and the on-switch SWON, included in the plurality of pixels PIX constituting the pixel array of the DVS 112.

The event occurrence and the event types of respective pixels may be determined by voltages of the on-event output terminal ON and the off-event output terminal OFF of the event output unit 340. In the present exemplary embodiment, since the off-capacitor COFF and the on-capacitor CON are connected to the off-event output terminal OFF and the on-event output terminal ON, respectively, and the data stored in the respective capacitors CON and COFF may be maintained for a predetermined period of time even when the switches SWOFF and SWON are turned off, a global shutter operation in which all the pixels are scanned for a corresponding time may be implemented. Thus, the event occurrence data may be processed at substantially the same point in time and thus, image distortion may be significantly reduced.

On the other hand, although the present exemplary embodiment illustrates the off-capacitor COFF and the on-capacitor CON, as units storing the event detection signals, by way of example, the capacitors may be replaced with storage devices, such as an SRAM or the like.

Figure 4:
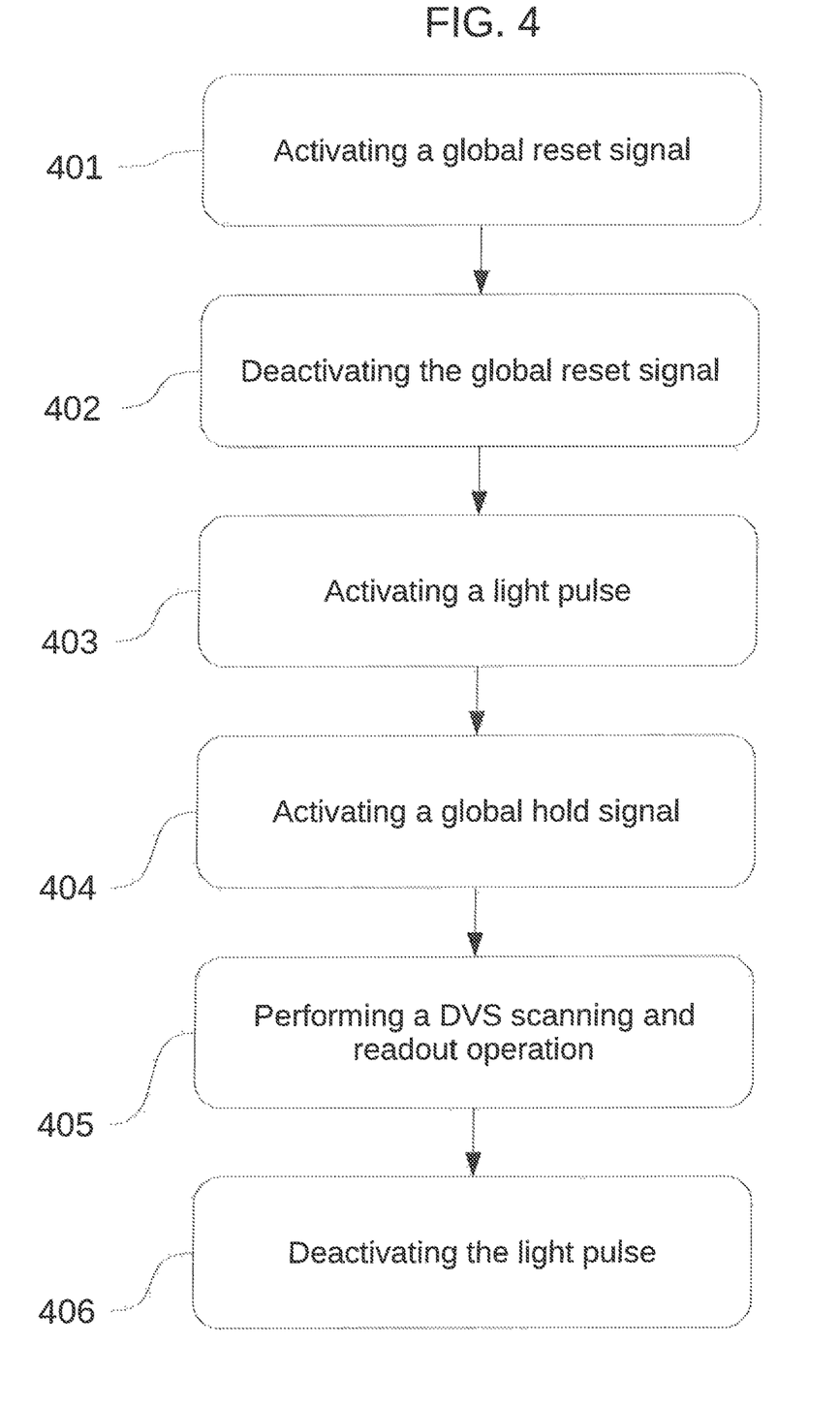
FIG. 4 is a flowchart illustrating a method of operating a pulsed image capturing system according to an exemplary embodiment of the inventive concept.

FIG. 4 is a flowchart illustrating a method of operating a pulsed image capturing system according to an exemplary embodiment of the inventive concept.

FIG. 4 will be described with reference to FIG. 1. However, the method of FIG. 4 may also be applied to the pulsed image capturing system 200 of FIG. 2.

Referring to FIG. 4, the global reset signal GRS may be activated and transmitted to each of the plurality of pixels PIX to set the reference illumination level for each of the plurality of pixels PIX (S401).

The global reset signal GRS may be deactivated to enable each of the plurality of pixels PIX to sense an illumination change amount with respect to the reference illumination level thereof (S402).

The pulsed light pattern PULSE may be activated to be directed at an external object (S403).

According to an exemplary embodiment of the inventive concept, an intensity of the pulsed light pattern PULSE may be adjusted based on an amount of ambient light. For example, when the amount of ambient light around the external object is relatively high, the intensity of the pulsed light pattern PULSE may be increased. Accordingly, the method according to the present exemplary embodiment may be employed in different environments with varying ambient light.

The global hold signal GHS may be activated and transmitted to each of the plurality of pixels PIX to hold an illumination change event indicating the illumination change amount thereof (S404). As described above, event signals may be generated by the plurality of pixels PIX based on a comparison between the illumination change amount and a predetermined threshold.

The DVS scanning and readout operation may be performed on the event signals received from the plurality of pixels PIX to generate the DVS output DVS_OUT (S405).

The pulsed light pattern PULSE may be deactivated (S406), e.g., at a predetermined time after the global hold signal GHS is activated. Although FIG. 4 illustrates a sequential performance of the operations, the inventive concept is not limited thereto. For example, operation S406 may be performed any time after operation S404, and may be performed before or in parallel with operation S405.

According to an exemplary embodiment of the inventive concept, operations S401 to S406 may be repeated. For example, the DVS output DVS_OUT may be generated at least two times and averaged to generate a final DVS output. In addition, if a sensitivity configuration is modified between iterations or passes, multiple DVS outputs DVS_OUT may be combined, e.g., by weighted sum, to generate a grey scale image, as described above.

Figure 5:
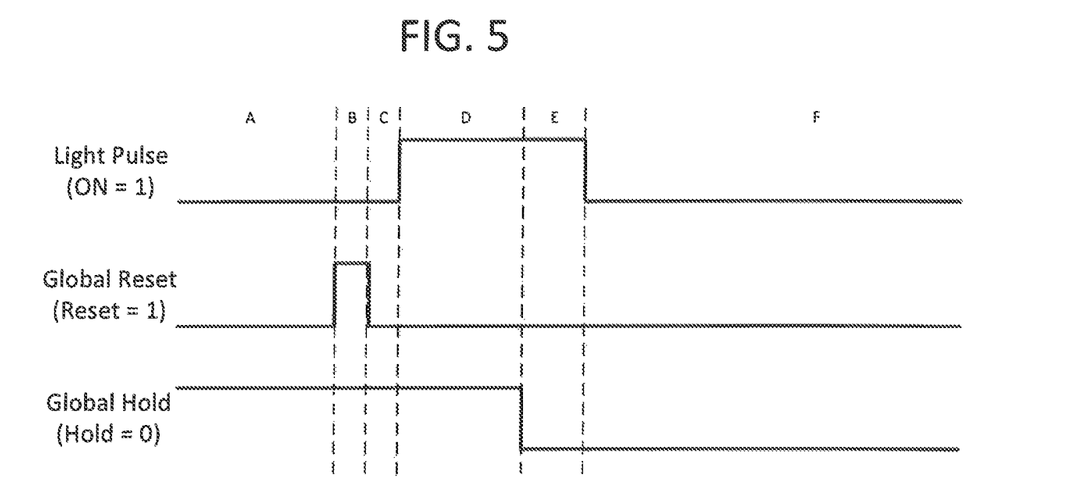
FIG. 5 is a timing diagram illustrating the method of FIG. 4 according to an exemplary embodiment of the inventive concept.

FIG. 5 is a timing diagram illustrating the method of FIG. 4 according to an exemplary embodiment of the inventive concept.

Referring to FIGS. 1, 3, and 4, in section A, the pulsed image capturing system 100 may be in an idle state.

In section B, the global reset signal GRS may be activated to capture the reference illumination levels for the plurality of pixels PIX, e.g., S401.

In section C, the global reset signal GRS may be deactivated/released to allow each of the plurality of pixels PIX to monitor changes with respect to their reference illumination levels, e.g., S402. For example, an illumination change amount may be a change in current flowing in a photodiode of each of the plurality of pixels PIX.

In section D, the pulsed light pattern PULSE may be activated for a predetermined amount of time, e.g., S403. The predetermined amount of time may be a relatively short period sufficient for the plurality of pixels PIX to react, e.g., monitor an illumination change amount with respect to the reference illumination levels.

After the illumination change amounts are detected, in section E, the global hold signal GHS may be activated or set to hold all detections (e.g., events) of the illumination change amounts, e.g., S404. At this point, any additional light will not affect the illumination change amounts detected by sensors of the plurality of pixels PIX. After the global hold signal GHS is in effect, e.g., activated, the previously recorded event signals may be output by the plurality of pixels PIX without being affected by illumination change amounts, for example, the illumination change due to the deactivation of the pulsed light pattern PULSE in section F.

In an exemplary embodiment of the inventive concept, when the pulsed light pattern PULSE is relatively small, the pulsed light pattern PULSE may affect a relatively small portion of the plurality of pixels PIX. In this case, the DVS scanning and readout circuit 113 may perform the DVS scanning and readout operation quickly so it is completed in less time than illustrated in FIG. 5, Section E. As such, the global hold signal GHS may be omitted, and the DVS scanning and readout operation (S405) may be performed in section E before the deactivation of the pulsed light pattern PULSE (S406).

In an exemplary embodiment of the inventive concept, activation/deactivation of the signals in sections A through E may be in the range of nanoseconds to microseconds according to a configuration of the DVS scanning and readout circuit 113.

After the global hold signal GHS is activated, the DVS scanning and readout circuit 113 may perform the DVS scanning and readout operation, e.g., S405. In other words, the DVS scanning and readout operation may be performed at any time after the global hold signal GHS is activated, e.g., in sections E or F.

Additionally, in section F, the pulsed light pattern PULSE may be deactivated, e.g., S406. As described above, deactivation of the pulsed light pattern PULSE may occur at any time after activation of the global hold signal GHS, e.g., prior to, in parallel with, or after the DVS scanning and readout operation. Accordingly, the pulsed image capturing system 100 may be ready for another activation as described with reference to sections A through E and operations S401 through S406.

Through the above-described operations of the synchronization mechanism, the DVS output DVS_OUT may yield a clean binary image of the pattern of the pulsed light pattern PULSE as projected on the external object while suppressing ambient light and extraneous scene information.

As described above, according to exemplary embodiments of the inventive concept, a system and method for pulsed light pattern capturing using an event or DVS sensor with a synchronized global hold and global reset mechanism are provided. Such a system and method may employ a very short light pulse which reduces system power and has high intensity to overcome outdoor ambient light without compromising eye safety. Thus, shot noise and interference may be reduced. Additionally, the DVS output may be processed without a need for intensive image processing to extract a pattern from the scene content and ambient light.

While the inventive concept has been shown and described with reference to exemplary embodiments thereof, it will be understood by those of ordinary skill in the art that various changes in form and detail may be made thereto without departing from the spirit and scope of the inventive concept as set forth by the following claims.

We claim:

1. A pulsed image capturing system, comprising:
    a pulse generation circuit configured to generate a pulsed light pattern at an external object;
    a dynamic vision sensor (DVS) including a pixel array having a plurality of pixels arranged in matrix form, wherein the plurality of pixels are configured to perform a light sensing operation to sense an amount of light from the pulsed light pattern reflected by the external object and output event signals;
    a DVS scanning and readout circuit configured to perform a DVS scanning and readout operation on the event signals received from the plurality of pixels to generate a DVS output; and
    a plurality of multiplexers configured to select a plurality of control signals, wherein the plurality of multiplexers comprises:
        a first multiplexer configured to select one of an internal light pulse synchronization signal and an external light pulse synchronization signal in response to a first selection signal;
        a second multiplexer configured to select one of an internal global reset signal and an external global reset signal in response to a second selection signal; and
        a third multiplexer configured to select one of an internal global hold signal and an external global hold signal in response to a third selection signal,
    wherein the internal light pulse synchronization signal and the external light pulse synchronization control when the pulsed light pattern is generated,
    the internal global reset signal and the external global reset signal control whether each of the plurality of pixels sets a reference illumination level in a current state, and
    the internal global hold signal and the external global hold signal control whether the plurality of pixels hold an illumination change event indicating a change with respect to the reference illumination level for each of the plurality of pixels;
    wherein the plurality of control signals synchronize operation of the pulsed image capturing system such that the light sensing operation is performed after the pulsed light pattern is generated and before the DVS scanning and readout operation is performed.

2. The pulsed image capturing system of claim 1, wherein the pulsed light pattern is generated, the light sensing operation is performed, and the DVS scanning and readout operation is performed for a predetermined number of passes, and
    the DVS output of the predetermined number of passes is averaged to generate a final DVS output.

3. The pulsed image capturing system of claim 1, wherein the pulsed light pattern is generated by one of a light emitting diode (LED) or a vertical-cavity surface-emitting laser (VCSEL).

4. The pulsed image capturing system of claim 1, wherein the pulsed light pattern includes a sequence of patterns.

5. The pulsed image capturing system of claim 1, further comprising a configuration register configured to store a rate of capture of the pulsed image capturing system and to generate the plurality of control signals.

6. The pulsed image capturing system of claim 1, wherein the first selection signal, the second selection signal, and the third selection signal are distinct signals.

7. A method of operating a pulsed image capturing system including a dynamic vision sensor (DVS) including a pixel array having a plurality of pixels, the method comprising:
    activating a global reset signal and transmitting the global reset signal to each of the plurality of pixels to set a reference illumination level for each of the plurality of pixels;
    deactivating the global reset signal to enable each of the plurality of pixels to sense an illumination change amount with respect to the reference illumination level thereof;
    activating a pulsed light pattern directed at an external object, wherein the pulsed light pattern includes a sequence of patterns that are the same, wherein for each of the sequence of patterns, a configuration of the pulsed image capturing system is changed;
    activating a global hold signal and transmitting the global hold signal to each of the plurality of pixels to hold an illumination change event indicating the illumination change amount thereof;
    performing a DVS scanning and readout operation on event signals received from the plurality of pixels and generating a DVS output; and
    deactivating the pulsed light pattern;
    wherein the DVS output is generated for each of the sequence of patterns, and a weighted sum of the DVS output for each of the sequence of patterns is determined as a final DVS output.

8. The method of claim 7, wherein the configuration of the pulsed image capturing system includes an adjustable duration between activation of the pulsed light pattern and transmission of the global hold signal.

9. The method of claim 7, wherein the configuration of the pulsed image capturing system includes adjustable sensitivity thresholds for each of the plurality of pixels.

10. The method of claim 7, wherein the DVS output is generated at least two times and averaged to generate a final DVS output.

11. A method of operating a pulsed image capturing system including a dynamic vision sensor (DVS) including a pixel array having a plurality of pixels, the method comprising:

activating a global reset signal and transmitting the global reset signal to each of the plurality of pixels to set a reference illumination level for each of the plurality of pixels;

deactivating the global reset signal to enable each of the plurality of pixels to sense an illumination change amount with respect to the reference illumination level thereof;

activating a pulsed light pattern directed at an external object;

activating a global hold signal and transmitting the global hold signal to each of the plurality of pixels to hold an illumination change event indicating the illumination change amount thereof;

performing a DVS scanning and readout operation on event signals received from the plurality of pixels and generating a DVS output; and deactivating the pulsed light pattern;

wherein the DVS output is generated at least two times and combined to create a grey scale image of the pulsed light pattern.

12. The method of claim 7, further comprising:

adjusting an intensity of the pulsed light pattern based on an amount of ambient light.

13. The method of claim 7, further comprising:

increasing a duration between activation of the pulsed light pattern and transmission of the global hold signal to increase a sensitivity to contrast change.

14. The method of claim 7, wherein the pulsed light pattern is deactivated before performing the DVS scanning and readout operation.

15. A method of operating a pulsed image capturing system including a dynamic vision sensor (DVS) including a pixel array having a plurality of pixels, the method comprising:

synchronizing activation of a global reset signal to be transmitted to the plurality of pixels to set a reference illumination level for each of the plurality of pixels;

deactivating the global reset signal to enable each of the plurality of pixels to sense an illumination change amount with respect to the reference illumination level thereof;

activating a pulsed light pattern directed at an external object after deactivation of the global reset signal, wherein the pulsed light pattern includes a sequence of patterns that are the same, wherein for each of the sequence of patterns, a configuration of the pulsed image capturing system is changed;

generating event signals, by the plurality of pixels, according to a comparison between a predetermined threshold and the sensed illumination change amount resulting from the pulsed light pattern; and performing a DVS scanning and readout operation on the event signals received from the plurality of pixels and generating a DVS output;

wherein the DVS output is generated for each of the sequence of patterns, and a weighted sum of the DVS output for each of the sequence of patterns is determined as a final DVS output.

* * * * *